United States Patent
Van Schaik et al.

(10) Patent No.: US 6,724,460 B2
(45) Date of Patent: Apr. 20, 2004

(54) LITHOGRAPHIC PROJECTION APPARATUS, DEVICE MANUFACTURING METHOD, DEVICE MANUFACTURED THEREBY, CLEANING UNIT AND METHOD OF CLEANING CONTAMINATED OBJECTS

(75) Inventors: Willem Van Schaik, 's-Hertogenbosch (NL); Antonie Ellert Duisterwinkel, Delft (NL); Bastiaan Matthias Mertens, 's-Gravenhage (NL); Hans Meiling, Bilthoven (NL); Norbertus Benedictus Koster, Delft (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 09/988,830

(22) Filed: Nov. 19, 2001

(65) Prior Publication Data

US 2003/0095240 A1 May 22, 2003

(51) Int. Cl.⁷ .......................... G03B 27/52; G03B 27/42
(52) U.S. Cl. ........................................ 355/30; 355/53
(58) Field of Search ................... 355/30, 53, 67–71; 134/1.3, 39; 250/492.2

(56) References Cited

U.S. PATENT DOCUMENTS

| | | | |
|---|---|---|---|
| 5,099,557 A | * | 3/1992 | Engelsberg ............... 29/25.01 |
| 5,559,584 A | * | 9/1996 | Miyaji et al. ................ 355/73 |
| 6,252,648 B1 | * | 6/2001 | Hase et al. .................. 355/53 |
| 6,288,769 B1 | * | 9/2001 | Akagawa et al. ............ 355/30 |
| 6,350,391 B1 | * | 2/2002 | Livshits et al. ............. 216/65 |
| 6,387,602 B1 | | 5/2002 | Hayden et al. ............. 430/327 |
| 6,394,109 B1 | * | 5/2002 | Somekh ...................... 134/39 |
| 6,411,368 B1 | | 6/2002 | Matsumoto et al. .......... 355/67 |

FOREIGN PATENT DOCUMENTS

EP 0 660 188 A1 6/1995

OTHER PUBLICATIONS

Bloomstein et al., "UV Cleaning of Contaminated 157–nm Reticles," *Proceedings of SPIE* 4346:669–375 (2001).
Liberman, "Reticle Materials Testing Facilities at MIT Lincoln Laboratory," presented Mar. 9, 2000.
Bloomstein et al., "UV Cleaning of Contaminated Reticles," presented Aug. 1, 2000.
Bloomstein et al., "Studies of Laser Induced Contamination and Cleaning," presented Nov. 21, 2000.
Bloomstein et al., "Optical Materials and Coatings at 157 nm," *Proceedings of SPIE* 3676:342–349 (1999).
Bloomstein et al., "Laser Cleaning of Optical Elements in 157–nm Lithography," *Proceedings of SPIE* 4000:1537–1545 (2000).
Bloomstein et al., "Controlled Contamination of Optics Under 157–nm Laser Irradiation," *Proceedings of SPIE* 4346:685–694 (2001).

* cited by examiner

*Primary Examiner*—Henry Hung Nguyen
(74) *Attorney, Agent, or Firm*—Pillsbury Winthrop LLP

(57) ABSTRACT

In-situ cleaning of optical components for use in a lithographic projection apparatus can be carried out by irradiating a space within the apparatus containing the optical component with UV or EUV radiation having a wavelength of less than 250 nm, in the presence of molecular oxygen. Generally, the space will be purged with an ozoneless purge gas which contains a small amount of molecular oxygen in addition to the usual purge gas composition. The technique can also be used in an evacuated space by introducing a low pressure of molecular oxygen into the space.

13 Claims, 2 Drawing Sheets

LITHOGRAPHIC PROJECTION APPARATUS, DEVICE MANUFACTURING METHOD, DEVICE MANUFACTURED THEREBY, CLEANING UNIT AND METHOD OF CLEANING CONTAMINATED OBJECTS

BACKGROUND OF THE INVENTION

1. Field of the Invention

The present invention relates generally to lithographic projection apparatus and more particularly to lithographic projection apparatus incorporating purge gas within the optical system.

2. Background of the Related Art

In general, lithographic apparatus such as are described herein include a radiation system for supplying a projection beam of electromagnetic radiation which may have a wavelength of 250 nm or less, for example. Such apparatus further generally include a support structure for supporting patterning structure which patterns the projection beam according to a desired pattern, a substrate table for holding a substrate and a projection system for projecting the patterned beam onto a target portion of the substrate.

The term "patterning structure" as here employed should be broadly interpreted as referring to means that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such patterning structure include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-adressable surface. The required matrix addressing can be performed using suitable electronic means. More information on such mirror arrays can be gleaned, for example, from U.S. Pat. Nos. 5,296,891 and 5,523,193, which are incorporated herein by reference. In the case of a programmable mirror array, the said support structure may be embodied as a frame or table, for example, which may be fixed or movable as required.

A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning structure as hereabove set forth.

Lithographic projection apparatus can be used, for example, in the manufacture of integrated circuits (ICs). In such a case, the patterning structure may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441 and WO 98/40791, both incorporated herein by reference.

To reduce the size of features that can be imaged using a lithographic projection apparatus, it is desirable to reduce the wavelength of the illumination radiation. Ultraviolet wavelengths of less than 200 nm are therefore currently contemplated, for example 193 nm, 157 nm or 126 nm. Also contemplated are extreme ultraviolet (EUV) wavelengths of less than 50 nm, for example 13.5 nm. Suitable sources of UV radiation include Hg lamps and excimer lasers. EUV sources contemplated include laser-produced plasma sources, discharge sources and undulators or wigglers provided around the path of an electron beam in a storage ring or synchrotron.

In the case of EUV radiation, the projection system will generally consist of an array of mirrors, and the mask will be reflective; see, for example, the apparatus discussed in WO 99/57596, incorporated herein by reference.

Apparatus which operate at such low wavelengths are significantly more sensitive to the presence of contaminant particles than those operating at higher wavelengths. Contaminant particles such as hydrocarbon molecules and water vapor may be introduced into the system from external sources, or they may be generated within the lithographic apparatus itself. For example the contaminant particles may include the debris and by-products that are liberated from the substrate, for example by an EUV radiation beam, or molecules produced through evaporation of plastics, adhesives and lubricants used in the apparatus.

These contaminants tend to adsorb to optical components in the system, and cause a loss in transmission of the radiation beam. When using 157 nm radiation, a loss in transmission of about 1% is observed when only one or a few monolayers of contaminant particles form on each optical surface. Such a loss in transmission is unacceptably high. Further, the uniformity requirement on the projection beam intensity for such systems is generally less than 0.2%. Localised contamination on optical components can cause this requirement not to be met.

Previous methods for cleaning optical components include, for example, the use of ozone as a cleaning material. However, ozone is a very unstable material and degrades only a few hours after its formation. If ozone is to be used to clean the optical surfaces, it is therefore necessary to produce it either in situ, or immediately before cleaning. An ozonizer may, for example, be used for this purpose. However, the extra step of producing the ozone itself is highly inconvenient.

SUMMARY OF THE INVENTION

It is therefore one aspect of embodiments of the present invention to provide a lithographic projection apparatus in which optical components can be cleaned with stable cleaning materials.

This and other features in accordance with embodiments of the present invention may be incorporated in lithographic apparatus as described above, wherein the apparatus further includes a gas supply for supplying a purge gas to a space in said apparatus, said space containing an optical component, and wherein said purge gas comprises an oxygen-containing species selected from water, nitrogen oxide and oxygen-containing hydrocarbons.

The inventors have found that the cleaning of optical components in a lithographic projection apparatus can be carried out by addition of relatively low partial pressures of stable oxygen-containing species—for example water, nitrogen oxides (NOx) or oxygen-containing organic species such as alcohols—to a purge gas which is fed to spaces through which the projection beam travels. As these materials themselves are not effective as cleaning agents, they are used in combination with UV radiation. The UV radiation cracks the oxygen-containing species to produce atomic oxygen or other oxygen containing radicals, which are highly effective cleaning agents. Amongst the oxygen-containing species, water was found to remove contaminants at a higher rate than molecular oxygen. With the said low concentrations of cleaning agent in the purge gas, the optical components can be cleaned while projecting a mask pattern onto a target portion with acceptable transmission loss due to absorption of UV radiation by the oxygen-containing species.

After cleaning according to the invention, the transmission or reflection of the radiation beam is increased and the uniformity may also be improved. The invention therefore provides a highly effective method of cleaning optical components in lithographic projection apparatus. It avoids the use of unstable materials such as ozone. Above all, it prevents very time-consuming dismounting of optical components (e.g. lens elements) out of the lithographic projection apparatus in order to clean the component in a separate cleaning unit.

However, patterning structure like a mask for example may be easily taken from its support structure. And in case a plurality of masks are stored in a mask storage box, an already-contaminated mask may be taken out of the storage box and may be cleaned before providing it to the support structure. For both scenarios, it is desirable to provide the lithographic projection apparatus with a separate cleaning unit. With such a cleaning unit, a mask can be readily cleaned after which it is ready for transport to the support structure and subsequently for exposure within a relatively short period of time. An alternative is an external cleaning unit, for which the mask to be cleaned must be taken out of the apparatus to the external cleaning unit, cleaned and brought back to the apparatus, which procedure obviously takes much more time compared to cleaning in the said internal cleaning unit. Moreover, the risk of re-contamination is much higher for an external cleaning unit due to the longer period of time between cleaning and exposure.

According to a further aspect of the present invention there is provided a device manufacturing method including providing a substrate that is at least partially covered by a layer of radiation-sensitive material, providing a projection beam of electromagnetic radiation having a wavelength of 250 nm or less, using patterning structure to endow the projection beam with a pattern in its cross-section, projecting the patterned beam of radiation onto a target portion of the layer of radiation-sensitive material, and cleaning an optical component for use in the apparatus by irradiating a space containing said optical component and/or said patterning structure with radiation having a wavelength of less than 250 nm in the presence of an oxygen-containing species selected from water, nitrogen oxide and oxygen-containing hydrocarbons.

In yet a further aspect of the invention a cleaning unit for cleaning contaminated objects is provided including a space, a radiation source for supplying and directing into said space radiation having wavelengths of 250 nm or less and a gas supply for supplying a purge gas into said space, wherein said purge gas includes an oxygen-containing species selected from water, nitrogen oxide and oxygen-containing hydrocarbons.

Such a cleaning unit is capable of cleaning contaminated objects to which hydrocarbon adlayers are adhered. These objects are not limited to the above-mentioned optical components or patterning structure, but can be any object contaminated with hydrocarbon adlayers.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (EUV or XUV) radiation (e.g. having a wavelength in the range 5–20 nm such as 12.5 nm) or soft x-rays, as well as particle beams, such as ion beams or electron beams.

BRIEF DESCRIPTION OF THE DRAWINGS

The invention and its various embodiments will be further described below with reference to exemplary embodiments and the accompanying schematic drawings, in which.

In the drawings, like parts are identified by like references.

DETAILED DESCRIPTION OF EMBODIMENTS OF THE INVENTION

Figure 1:
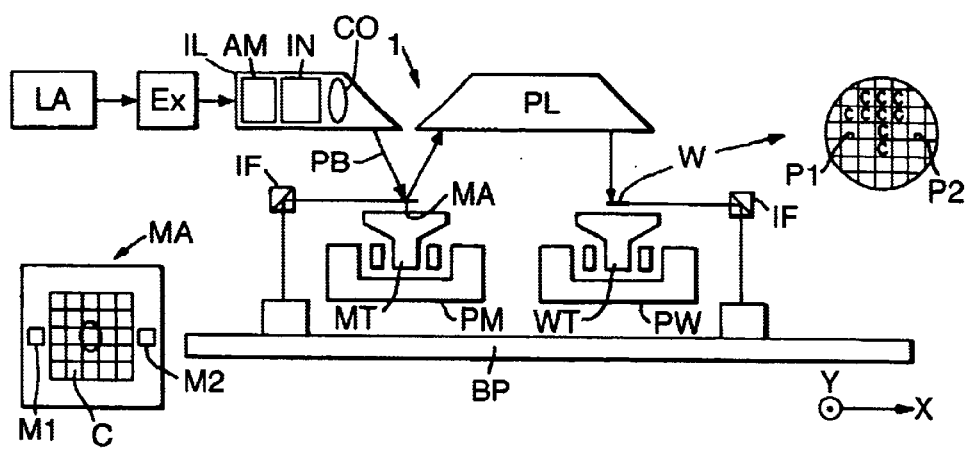
FIG. 1 depicts a lithographic projection apparatus according to the invention.

FIG. 1 schematically depicts a lithographic projection apparatus according to the invention. The apparatus includes:

- a radiation system LA, IL for supplying a projection beam PB of UV or EUV radiation;
- a first object table (mask table) MT for holding a mask MA (e.g. a reticle), and connected to first positioning means for accurately positioning the mask with respect to item PL;
- a second object table (substrate or wafer table) WT for holding a substrate W (e.g. a resist-coated silicon wafer), and connected to second positioning means for accurately positioning the substrate with respect to item PL;
- a projection system ("lens") PL (e.g. a mirror group) for imaging an irradiated portion of the mask MA onto an exposure area C of a substrate W held on the substrate table WT.

As here depicted, the apparatus is of a reflective type (i.e. has a reflective mask). However, in general, it may also be of a transmissive type, for example.

The radiation system may include a source LA (e.g. an Hg lamp, an excimer laser, a laser-produced plasma source, a discharge plasma source or an undulator or wiggler provided around the path of an electron beam in a storage ring or synchrotron) which produces a beam of UV or EUV radiation. This beam is caused to traverse various optical components comprised in the illumination system IL—e.g. beam shaping optics, an integrator and a condenser—also included in the radiation system so that the resultant beam PB has a desired shape and intensity distribution in its cross-section.

The beam PB subsequently intercepts the mask MA which is held on a mask table MT. Having been selectively reflected by the mask MA, the beam PB traverses the lens PL, which focuses the beam PB onto an exposure area C of the substrate W. With the aid of the interferometric displacement measuring means IF, the substrate table WT can be moved acurately by the second positioning means, e.g. so as to position different exposure areas C in the path of the beam PB using wafer alignment marks P1, P2. Similarly, the first positioning means can be used to accurately position the mask MA using mask alignment marks M1, M2 with respect to the path of the beam PB. In general, movement of the object tables MT, WT will be realized with the aid of a long-stroke module (course positioning) and a short-stroke module (fine positioning), which are not explicitly depicted in FIG. 1. In the case of a waferstepper (as opposed to a step-and-scan apparatus) the mask table may be connected only to a short-stroke positioning device, to make fine adjustments in mask orientation and position, or it may simply be fixed.

The depicted apparatus can be used in two different modes:

In step-and-repeat (step) mode, the mask table MT is kept essentially stationary, and an entire mask image is projected at once (i.e. a single "flash") onto an exposure area C. The substrate table WT is then shifted in the X and/or Y directions so that a different exposure area C can be irradiated by the beam PB;

In step-and-scan (scan) mode, essentially the same scenario applies, except that a given exposure area C is not exposed in a single "flash". Instead, the mask table MT is movable in a given direction (the so-called "scan direction", e.g. the Y direction) with a speed v, so that the projection beam PB is caused to scan over a mask image; concurrently, the substrate table WT is moved in the same or opposite direction at a speed V=Mv, in which M is the magnification of the lens PL (typically, M=1/4 or 1/5). In this manner, a relatively large exposure area C can be exposed, without having to compromise on resolution.

In an embodiment of the present invention, the optical component to be cleaned is an optical component within the illumination system. However, the present invention may be used to remove contaminants from any optical component in the system, for example the mask or the optical components contained within the projection system. The present invention can be applied to one or several optical components either simultaneously or separately.

Figure 2:
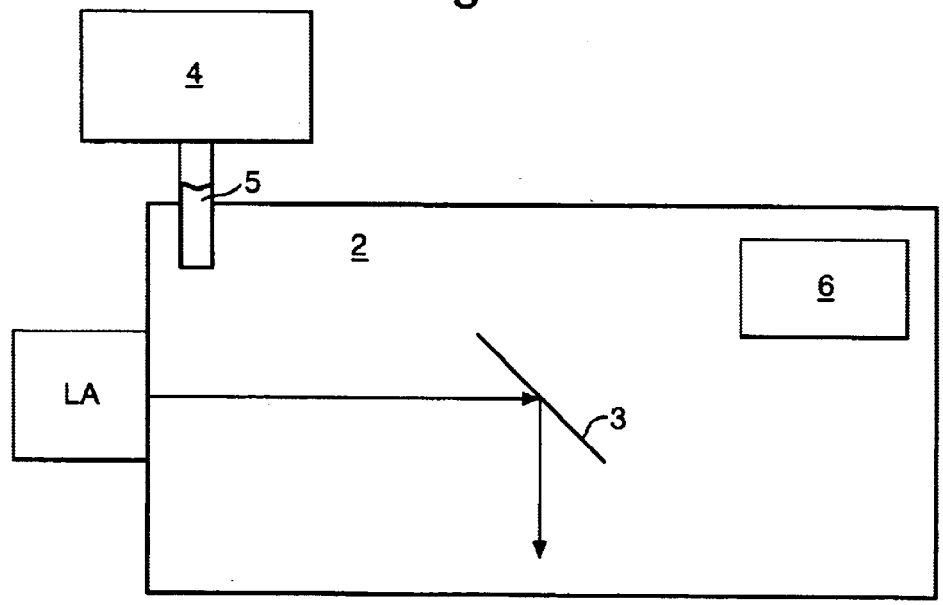
FIG. 2 depicts a part of the illumination system of an embodiment of the invention.

FIG. 2 shows a part of the illumination system of a specific embodiment of the invention in more detail. A space 2 within the illumination system, and containing an optical component 3, is supplied with a purge gas from purge gas supply 4, which may be a pressurized container containing the purge gas in gaseous or liquid form. The purge gas comprising an oxygen-containing species is supplied to the space 2 via inlet 5, which may comprise a valve. Space 2 now containing the oxygen-containing species is then irradiated with UV or EUV radiation, which is produced by the source LA. In this embodiment, the irradiation step is carried out at the same time as exposure, i.e. the projection beam PB is used to crack the oxygen-containing species.

The oxygen-containing species within the space, when irradiated with UV or EUV radiation having a wavelength of about 250 nm or less, are cracked, forming oxygen radicals and other radicals which may be OH-radicals or other hydrocarbon radicals depending on the nature of the oxygen-containing species. The oxygen radicals formed act as highly effective cleaning agents and remove hydrocarbons and other contaminant particles from the surface of the optical component.

The purge gas may contain one or a mixture of oxygen-containing species selected from water, nitrogen oxide (NOx) and oxygen-containing hydrocarbons. Suitable oxygen-containing hydrocarbons include alcohols, alkanones and ethers. Other useful oxygen-containing hydrocarbons are those with a high O:C ratio such as $C_{1-6}$ alcohols (comprising 1 ($C_1$) to 6 ($C_6$) carbon atoms) including methanol, ethanol and propanol, $C_{1-6}$ alkanones such as formaldehyde, ethanal, propanal and acetone and $C_{1-6}$ ethers such as methoxy methane, ethoxy methane and ethoxy ethane. Likewise, the inventors contemplate the use of oxygen-containing species for use in the present invention including water, nitrogen oxide, methanol and ethanol. These compounds may be used alone or as a mixture of 2 or more compounds.

The inventors have compared the cleaning rates of molecular oxygen and water, while exposing pre-contaminated reticles with 172 nm radiation. They found that water is able to clean the said reticles, thereby restoring their transmission, much faster than molecular oxygen. Addition of molecular oxygen and water to the purge gas does not significantly influence the cleaning rate compared to mere water addition. At the employed wavelength the dissociation rate of water is significantly higher than the rate of oxygen dissociation. Moreover, it appears that water is dissociated by ultraviolet radiation in a different manner than molecular oxygen. From experiments it is deduced that water predominantly dissociates at the surface of the reticle, thereby forming highly reactive OH-radicals. As these OH-radicals are located near to or on the hydrocarbon contaminant residing on said surface, it reacts readily therewith. Molecular oxygen is believed not to dissociate at the surface but in the space surrounding the reticle. Apparently, such a difference in dissociation behavior between water and oxygen may explain the discrepancy in cleaning rates.

In one embodiment of the present invention the space containing the optical component to be cleaned is purged with a substantially inert gas. In this case the oxygen-containing species are present in a small amount in the purge gas. The purge gas may comprise any gaseous composition which is suitable for use in a lithographic apparatus, together with one or more oxygen-containing species as defined above. Typical purge gases comprise one or a mixture of inert gases such as noble gases or nitrogen, together with one or more oxygen-containing species as defined above. Additionally, useful inert gases include argon, helium and nitrogen, for example ultra-pure nitrogen.

The inventors have determined that there may be an advantage to the use of purge gas compositions of the invention consisting only of one or more inert gases and one or more oxygen-containing species as defined above. As a result, there may be an advantage if other contaminants are removed from the gas. Typically, a purifier is used to remove hydrocarbons from the purge gas. It is possible to use a purifier in the present invention which removes most hydrocarbons but does not affect the presence of the relevant oxygen-containing species.

The total amount of oxygen-containing species present in the purge gas is typically from about 1 ppb to about 10 ppm by volume. If the amount of oxygen-containing species is less than about 1 ppb by volume, the amount of contaminant which is removed from the optical component may be insufficient, unless cleaning is carried out for a period of several hours, which is in itself undesirable. Further, concentrations of below about 1 ppb may be very difficult to detect.

Alternatively, if the concentration of oxygen-containing species is above about 1 ppm by volume, the absorption of the projection beam by the oxygen-containing species is generally so high that the transmission is decreased below an acceptable level. The level of transmission loss due to this absorption of the projection beam depends on the path length of the optical system to be cleaned. For example, the beam delivery system in general has a much longer path length than the illumination system and a decrease in transmission of 10% due to UV-absorption in the beam delivery system may equate to a decrease of around only 1% in the illumination system, given the same concentration of oxygen-containing species. Therefore, while a concentration of around 1 ppm may be acceptable in an illumination system, systems with a longer path length may require lower concentrations such as 300 or 400 ppb.

In a variation of the first embodiment of the present invention, the space containing the optical component to be cleaned is evacuated. In this embodiment, the oxygen-containing species or mixture of oxygen-containing species may be substantially the only component(s) of the purge gas. The purge gas is introduced into the space at a low partial pressure. The pressure of the oxygen-containing species in the space must be sufficiently high that contaminants can be effectively cleaned from the optical component within a reasonable time, but sufficiently low that the transmission of the projection beam is not reduced below an acceptable level. Typically, the total partial pressure of all oxygen-containing species present is from about $1 \times 10^{-4}$ Pa to about 1 Pa. If the pressure is below about $1 \times 10^{-4}$ Pa, cleaning must be carried out for several hours in order to remove a sufficient amount of contaminant. Conversely, if the pressure is above about 1 Pa, absorption of the (E)UV radiation by the oxygen-containing species is high, causing an unacceptable loss in transmission. As described above, the maximum acceptable amount of oxygen-containing species used may vary depending on the path length of the system to be cleaned.

If desired, the degree of contamination may be monitored using sensor 6. Sensor 6 acts by measuring the reflectance or transmission of (E)UV radiation by the optical component to be cleaned. As is depicted in FIG. 2, the optical component may be reflective, and the sensor will therefore measure the reflectance of the (E)UV radiation. However, if the optical component is of a transmissive type, the sensor will be positioned such that it measures the degree of transmission through the optical component.

The degree of absorption of (E)UV radiation can be used to indicate the degree of coverage of the optical component with contaminants. In this embodiment, the system will generally be purged of all (E)UV absorbing agents except the oxygen-containing species, whose concentration is known and may be kept constant. Therefore, any (E)UV absorption observed, aside from that which can be attributed to the oxygen-containing species present, is due to the presence of contaminants. The sensor can, in this way, be used to monitor the level of contamination, and any changes to the level of contamination, of the optical system.

The sensor may be employed before and/or after cleaning to indicate whether the optical component in question is sufficiently clean for exposure to take place, or whether further cleaning is required. Regular use of this detection process may be desirable so that it can be determined when an optical component requires cleaning. The sensor may also be used during the cleaning process. Cleaning is carried out as described above, and while irradiation is taking place, the absorption of said radiation is monitored using sensor 6. When the sensor indicates that the absorption level has dropped below a sufficient level, and thus the contamination level of the optical component is acceptable, the cleaning process may be stopped.

In another variation of the first embodiment, the optical components and/or mask is cleaned with one or more of the cleaning agents in between exposing wafers. For example, between two batches of wafers or on a regular basis e.g. as part of a general maintenance program. In this way, higher concentrations of the cleaning agent can be used as wafers are not exposed and transmission loss during cleaning is not detrimental.

In a second embodiment of the invention, which is the same as the first embodiment except as described below, cleaning is carried out as a separate process and/or at a different time from exposure, e.g. cleaning the mask in a separate unit within the lithographic apparatus.

In this embodiment the amount of oxygen-containing species is not limited by an acceptable loss in transmission of the projection beam and concentrations of greater than 10 ppm (or higher partial pressures than 1 Pa) may be used. Thus, for example concentrations of up to 20% of oxygen-containing species in an inert gas are suitable. In particular, water concentrations of, for instance, 1000 to 15000 ppm can be used.

Typically, the apparatus is not evacuated since illumination is not carried out at the same time as cleaning and evacuation is unnecessary. However, if the apparatus is evacuated, the total partial pressure of oxygen-containing species may be as high as approximately $2 \times 10^4$ Pa. In particular, water concentrations of, for instance, 100 to 1500 Pa can be used.

In general, increasing the amount of oxygen-containing species present is advantageous since it reduces the cleaning time and thereby reduces the down-time of the apparatus.

This embodiment, when employed with concentrations of oxygen-containing material of greater than 10 ppm (or 1 Pa in vacuum) provides an increased cleaning effect which can be used when it is necessary to remove large amounts, or particularly strongly adsorbed contaminants. This technique may be used, for example, when it is known that contaminant levels are particularly high, on starting-up the apparatus, or on a regular basis e.g. as a part of a general maintenance program.

It must be noted that the above-described cleaning unit may also be employed outside the lithographic projection apparatus as a separate cleaning unit. With such an external cleaning unit all kinds of contaminated objects can be cleaned with for example water, nitrogen oxides or oxygen-containing hydrocarbons, while exposing the object with ultraviolet radiation. The objects to be cleaned are not limited to optical components or patterning structure as described above, but do also encompass e.g. metal sheets, (resist-coated) wafers, solar panels or any other kind of contaminated article.

Figure 3:
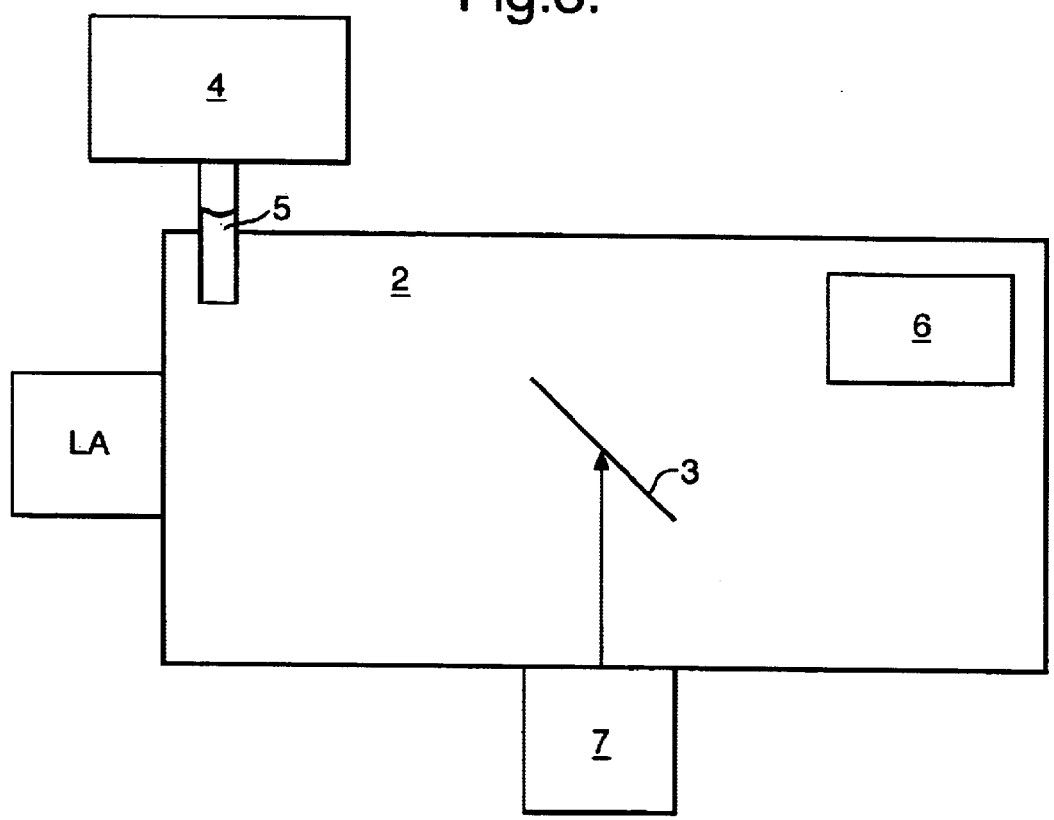
FIG. 3 depicts a part of the illumination system of a further embodiment of the invention.

FIG. 3 depicts a third embodiment of the invention, which is the same as the second embodiment except as described below. In this embodiment a further source of UV or EUV radiation 7 is provided. Source 7 provides radiation having a wavelength of 250 mn or less. Suitable sources of such radiation are the same as those described above with reference to source LA.

In this embodiment, the optical component 3 is irradiated by either EUV or UV radiation having wavelengths shorter than 250 nm, while simultaneously projecting the patterned beam of EUV radiation. Most frequently, UV radiation is used, which is capable of selectively dissociating the oxygen-containing species more profoundly than EUV radiation. For example in the case of oxygen, UV radiation having wavelength of about 157 nm may be used. In this way, relatively low concentrations of the oxygen-containing species in the purge gas can be employed to ensure relatively low absorption of EUV radiation by the cleaning agent. Consequently, the optical component 3 can be cleaned, while exposing a wafer, with acceptable transmission loss.

It is further contemplated to irradiate the optical component 3 located in space 2 using the UV or EUV radiation supplied from source 7, either before or after exposure by the projection beam PB. Irradiation may be carried out before exposure, thus providing a cleaned optical component which will improve the transmission and uniformity levels during exposure. In this embodiment, the radiation provided by source 7 is depicted as being directed at optical component 3. However, it is also possible to direct the radiation other than directly at the optical component, for example across the optical component.

If desired, sensor 6 may be used to monitor the level of contamination as described above.

In the embodiments described above, a mask or reticle is described, which may also comprise a pellicle. In a space between the mask and the pellicle, a purge gas comprising a cleaning agent can be supplied in order to remove contaminants from said space according to the above-described cleaning process.

While we have described above specific embodiments of the invention it will be appreciated that the invention may be practiced otherwise than described. The description is not intended to limit the invention.

What is claimed is:

1. A lithographic projection apparatus comprising:
   a radiation system to supply a projection beam of electromagnetic radiation having a wavelength of 250 nm or less;
   a support structure adapted to support patterning structure which can be used to pattern the projection beam according to a desired pattern;
   a substrate table to hold a substrate;
   a projection system to project the patterned beam onto a target portion of the substrate; and
   a gas supply constructed and arranged to supply a purge gas to a space in said apparatus, said space containing an optical component, wherein said purge gas comprises an oxygen-containing species selected from water, nitrogen oxide and oxygen-containing hydrocarbons;

wherein said purge gas comprises an inert gas, and wherein the total amount of oxygen-containing species present in said purge gas is from 1 ppb to 10 ppm by volume.

2. An apparatus as in claim 1, wherein the inert gas comprises helium, argon, nitrogen or a mixture thereof.

3. An apparatus according to claim 1, wherein said oxygen-containing species is selected from water, nitrogen oxide, alcohols, alkanones and ethers.

4. An apparatus according to claim 1, wherein said space is substantially evacuated, and wherein a total partial pressure of the oxygen-containing species in said space is from $1 \times 10^{-4}$ Pa to 1 Pa.

5. An apparatus according to claim 1, which apparatus further comprises a further supply of electromagnetic radiation having a wavelength of 250 nm or less and arranged to supply such radiation onto at least one of said optical component and said patterning structure.

6. An apparatus according to claim 1, which apparatus further comprises a separate cleaning unit to clean patterning structure comprising a space, a radiation source for supplying and directing into said space radiation having wavelengths of 250 nm or less and a gas supply for supplying a purge gas into said space, wherein said purge gas comprises an oxygen-containing species selected from water, nitrogen oxide and oxygen-containing hydrocarbons.

7. A device manufacturing method comprising:
   projecting a patterned beam of radiation having a wavelength of 250 nm or less onto a target portion of a layer of radiation-sensitive material on a substrate, and
   cleaning an optical component for use in the apparatus by irradiating a space containing said optical component with radiation having a wavelength of less than 250 nm in the presence of an oxygen-containing species selected from water, nitrogen oxide and oxygen-containing hydrocarbons;
   wherein the total amount of oxygen-containing species present is from 1 ppb to 10 ppm by volume.

8. A method according to claim 7, further comprising the step of supplying to said space containing said optical component and/or said patterning structure a purge gas comprising an inert gas, preferably helium, argon, nitrogen or a mixture thereof.

9. A method according to claim 7, further comprising supplying to said space containing said optical component and/or said patterning structure a purge gas comprising oxygen-containing species selected from water, nitrogen oxide, alcohols, alkanones and ethers.

10. A method according to claim 7, wherein said cleaning step is carried out separately from said step of projecting the patterned beam of radiation.

11. A device manufactured according to the method of claim 1.

12. A cleaning unit for cleaning contaminated objects comprising a space, a radiation source for supplying and directing into said space radiation having wavelengths of 250 nm or less and a gas supply for supplying a purge gas into said space, wherein said purge gas comprises an oxygen-containing species selected from water, nitrogen oxide and oxygen-containing hydrocarbons and wherein the total amount of oxygen-containing species present in said purge gas is from 1 ppb to 10 ppm by volume.

13. A method of cleaning contaminated objects comprising:
   directing radiation having a wavelength of 250 nm or less onto an object in a space, and
   supplying a purge gas to said space, wherein the purge gas comprises an oxygen-containing species selected from water, nitrogen oxide and oxygen-containing hydrocarbons; and
   wherein the total amount of oxygen-containing species present in said purge gas is from 1 ppb to 10 ppm by volume.

* * * * *